United States Patent
Dang et al.

(10) Patent No.: US 8,990,479 B2
(45) Date of Patent: Mar. 24, 2015

(54) USING PERSISTENT MEMORY REGIONS WITHIN MEMORY DEVICES TO COLLECT SERIAL PRESENCE DETECT AND PERFORMANCE DATA

(75) Inventors: Tu To Dang, Cary, NC (US); Juan Q. Hernandez, Garner, NC (US); Sumeet Kochar, Apex, NC (US); Jung H. Yoon, Poughkeepsie, NY (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 110 days.

(21) Appl. No.: 13/561,306

(22) Filed: Jul. 30, 2012

(65) Prior Publication Data

US 2014/0032819 A1    Jan. 30, 2014

(51) Int. Cl.
 *G06F 12/00* (2006.01)
(52) U.S. Cl.
 USPC ............ 711/103; 711/154; 711/173; 714/721
(58) Field of Classification Search
 CPC ................ G11C 29/50; G11C 16/349; G11C 2029/5002; G11C 16/225; G11C 29/82
 USPC ............................ 711/103, 154, 173; 714/721
 See application file for complete search history.

(56) References Cited

U.S. PATENT DOCUMENTS

| | | | | |
|---|---|---|---|---|
| 6,381,685 | B2 * | 4/2002 | Dell et al. | 711/170 |
| 6,446,184 | B2 * | 9/2002 | Dell et al. | 711/170 |
| 7,487,428 | B2 | 2/2009 | Co et al. | |
| 8,037,275 | B2 * | 10/2011 | Shin et al. | 711/173 |
| 2004/0210800 | A1 | 10/2004 | Ghislain et al. | |
| 2007/0101114 | A1 * | 5/2007 | Inoue et al. | 713/1 |
| 2007/0277016 | A1 | 11/2007 | Risse | |
| 2009/0089604 | A1 | 4/2009 | Malik et al. | |
| 2009/0150721 | A1 | 6/2009 | Kochar et al. | |
| 2009/0254781 | A1 | 10/2009 | Bonaccio et al. | |
| 2010/0030976 | A1 * | 2/2010 | Tashima et al. | 711/154 |
| 2010/0070690 | A1 * | 3/2010 | Amer et al. | 711/103 |
| 2010/0115179 | A1 * | 5/2010 | Carr et al. | 711/103 |
| 2010/0115180 | A1 * | 5/2010 | Lee et al. | 711/103 |

(Continued)

OTHER PUBLICATIONS

IBM, Method of Collecting and Tracking Memory Module's Field Performance Data in a Personal Computer, IP.com Prior Art Database Technical Disclosure, pub Jan. 1, 2000, electronic pub Jun. 18, 2003, 3 pages.

*Primary Examiner* — Hong Kim
(74) *Attorney, Agent, or Firm* — Edward J. Lenart; Katherine S. Brown; Kennedy Lenart Spraggins LLP

(57) ABSTRACT

An approach to determine a power-on-hour offset for a memory device that is newly-installed into a computer system is provided, which subtracts a current power-on-hour count of the memory device from a current power-on-hour value of a power supply that supplies operative power to the memory device within the computer system. In response to the computer system powering down, an accumulated power-on-hour for the memory device is determined by subtracting the power-on-hour offset of the memory from a current power-on-hour value of the computer system power supply. The determined power-on-hour offset and accumulated power-on-hour values are saved into one or more designated bytes of a free area of electrically erasable programmable read-only memory of the memory device that are available for data storage by a memory controller, and wherein data stored therein persists after operative power is lost to the memory device, the memory controller or the computer system.

20 Claims, 2 Drawing Sheets

(56) References Cited

U.S. PATENT DOCUMENTS

| | | |
|---|---|---|
| 2010/0313072 A1 | 12/2010 | Suffern |
| 2011/0082971 A1 | 4/2011 | Berke |
| 2013/0325388 A1 | 12/2013 | Joensuu |
| 2014/0013036 A1* | 1/2014 | Kwon et al. .......... 711/103 |

* cited by examiner

USING PERSISTENT MEMORY REGIONS WITHIN MEMORY DEVICES TO COLLECT SERIAL PRESENCE DETECT AND PERFORMANCE DATA

FIELD OF THE INVENTION

Embodiments of the present invention relate to collecting and persistently storing installation information and performance data on or in association with a computer system memory device.

BACKGROUND

Driven by cloud computing and virtualization technology and other increasing business and consumer demands for data storage, new generations of Information Handling Systems, servers and other computer systems are increasingly demanding greater memory bandwidth capabilities. More particularly, new generations of memory devices are being introduced that provide progressively higher memory density and capacity and faster speeds, in some examples over similar sizes and footprints of prior generations of memory devices. However, as higher and more efficient performance is asked or required for memory devices, memory "No Defect Found" (NDF) rate and Error-Correction Code (ECC) errors are increasing, in some examples exponentially. Increasing error rates present a significant impact with respect to warranty costs, and may present a major challenge for quality improvement.

BRIEF SUMMARY

In one embodiment of the present invention, a method collects memory device performance data and populates the data in a persistent memory component of the memory device. The method includes determining via a power-on self-test whether a memory device installed on a computer system is a newly installed memory, wherein the power-on self-test collects serial presence detect data from each of a plurality of bytes of a reserved area of electrically erasable programmable read-only memory of the memory device that are each reserved for encoding manufacturer information for the device. A processing unit of the computer system automatically uses the collected serial presence detect data to configure a memory controller of the computer system to interface with the memory device. In response to determining that the memory device is a newly installed memory, a power-on-hour offset is determined for the memory device by subtracting a current power-on-hour count of the memory device from a current power-on-hour value of a computer system power supply that supplies operative power to the memory device. The determined power-on-hour offset is saved into one or more bytes of a free area of the electrically erasable programmable read-only memory of the memory device that is designated by computer system firmware for the power-on-hour offset. In response to the computer system powering down, an accumulated power-on-hour for the memory device is determined by subtracting the power-on-hour offset of the memory from a current power-on-hour value of the computer system power supply, and saved to one or more bytes designated by the computer system firmware within the free area of the memory device electrically erasable programmable read-only memory for the accumulated power-on-hour for the memory device. More particularly, the free area bytes are different from the reserved area bytes, and wherein each of the free area bytes are available for data storage by the memory controller, and data stored in the free area bytes persists after operative power is lost to the memory device, the memory controller or the computer system.

In another embodiment, a system has a processing unit, computer readable memory and a computer readable storage medium device with program instructions. The processing unit, when executing the stored program instructions, determines via a power-on self-test whether a memory device is a newly installed memory device, wherein the power-on self-test collects serial presence detect data from each of a plurality of bytes of a reserved area of electrically erasable programmable read-only memory of the memory device that are each reserved for encoding manufacturer information for the device. The processing unit automatically uses the collected serial presence detect data to configure a memory controller of to interface with the memory device, and, in response to determining that the memory device is a newly installed memory, determines a power-on-hour offset for the memory device by subtracting a current power-on-hour count of the memory device from a current power-on-hour value of a computer system power supply that supplies operative power to the memory device. The determined power-on-hour offset is saved into one or more bytes of a free area of the electrically erasable programmable read-only memory of the memory device that is designated by computer system firmware for the power-on-hour offset. In response to the computer system powering down, an accumulated power-on-hour for the memory device is determined by subtracting the power-on-hour offset of the memory from a current power-on-hour value of the computer system power supply, and saved to one or more bytes designated within the free area of the memory device electrically erasable programmable read-only memory for the accumulated power-on-hour for the memory device. More particularly, the free area bytes are different from the reserved area bytes, and wherein each of the free area bytes are available for data storage by the memory controller, and data stored in the free area bytes persists after operative power is lost to the memory device, the memory controller or the computer system.

In another embodiment, an article of manufacture has a computer readable storage medium device with computer readable program code embodied therewith, the computer readable program code comprising instructions that, when executed by a computer processor, cause the computer processor to determine via a power-on self-test whether a memory device is a newly installed memory device. The power-on self-test collects serial presence detect data from each of a plurality of bytes of a reserved area of electrically erasable programmable read-only memory of the memory device that are each reserved for encoding manufacturer information for the device. The processing unit automatically uses the collected serial presence detect data to configure a memory controller of to interface with the memory device, and, in response to determining that the memory device is a newly installed memory, determines a power-on-hour offset for the memory device by subtracting a current power-on-hour count of the memory device from a current power-on-hour value of a computer system power supply that supplies operative power to the memory device. The determined power-on-hour offset is saved into one or more bytes of a free area of the electrically erasable programmable read-only memory of the memory device that are designated by computer system firmware for the power-on-hour offset. In response to the computer system powering down, an accumulated power-on-hour for the memory device is determined by subtracting the power-on-hour offset of the memory from a current power-on-hour value of the computer system power supply, and saved to one or more bytes designated within the free area of the memory device electrically erasable programmable read-only memory for the accumulated power-on-hour for the memory device. More particularly, the free area bytes are different from the reserved area bytes, and wherein each of the free area bytes are available for data storage by the memory controller, and data stored in the free area bytes persists after operative power is lost to the memory device, the memory controller or the computer system.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings in which.

Figure 1:
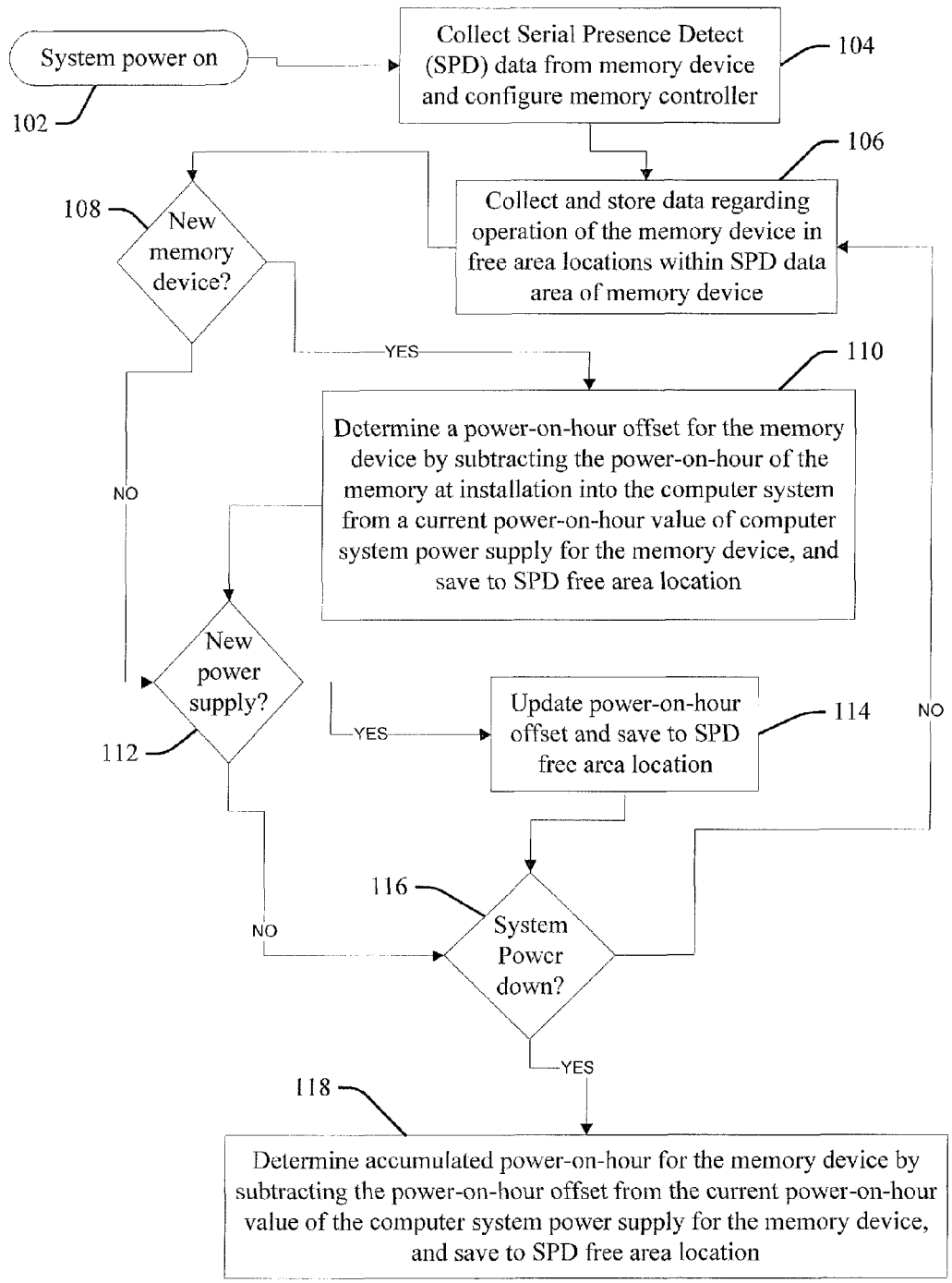
FIG. 1 is a block diagram illustration of an embodiment according to the present invention that collects and determines installation and performance data for a memory device with a computer system, and populates the collected and determined data in a persistent memory component of the memory device.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an electrically erasable programmable read-only memory (EEPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 illustrates a method, system or process according to the present invention for collecting or determining installation and performance data for a memory device with a computer system, and populating the collected or determined data in a persistent memory component of the memory device. When a computer system is powered up at 102, it performs a power-on self-test (POST) at 104 that collects Serial Presence Detect (SPD) data from a memory device installed on the computer system and automatically configures a memory controller to interface with the memory device. More particularly, SPD is a memory hardware feature that describes a standardized way for the computer system to automatically access information about an installed computer memory module directly from data stored at designated addresses on the memory. SPD data makes it possible for the computer to know what memory is present, and what timings to use to access the memory, etc.

In one example, the memory device is a double data rate type three synchronous dynamic random access memory (DDR3 SDRAM). Pursuant to a Joint Electron Devices Engineering Council (JEDEC) specification for SPD for this type of memory, a lower 176 bytes of SPD EEPROM address space, from byte 0 through byte 175, is reserved for DRAM module manufacturers to encode device information that contains timing parameters, manufacturer, serial number, and other useful information about the module, and accordingly the process reads this data at 104 to configure the memory controller, etc.

Another, upper 80 bytes of the SPD EEPROM address space, from address offset 176 through 255, is a "free user area" that is available for use by the computer system. Accordingly, at 106 the present embodiment collects and stores data regarding the operation of the memory device, on a continuing, on-going basis during operation of the memory device, in certain locations within this free area or another persistent memory component of the memory device. More particularly, data stored in the free area locations persists after power to the memory device, memory controller or computer system is lost. This collected operating data is useful for failure analysis and further quality improvement and illustrative but not exhaustive examples include system machine type, serial number, total system memory size, SDRAM refresh setting, memory power saving mode enable/disable, failed DIMM's (dual in-line memory module) bank, row/column address, chip select, and data lines (DQ) information, time of fail, power on hour, etc.

For the initial installation of a new memory device (that is, if recognized at 108 as new since a previous power-up POST execution at 102), at 110 a processing unit of the computer system determines a power-on-hour offset (POH(Offset)) for the memory device and saves it to the persistent SPD free area of the memory device. "Power on hour" counts may be used to count and keep track of a total time (for example, number of hours, minutes, etc.) that the memory device has been powered on since it was first used in a computer environment, including within this computer system and any prior computer system installations. The present example determines the power-on-hour offset at 108 by retrieving or determining the current power-on-hour count of the memory at the present time (POH(Memory-new)) from the data saved to the lower 176 bytes of SPD address space. The determined POH (Memory-new) value is then subtracted from a current power-on-hour value of a computer system power supply (POH(PS-current)) for the memory device to determine the offset according to the expression: {POH(Offset)=POH(PS-current)−POH(Memory-new)}. In the present example if there is more than one power supply, then the primary power supply of the computer system is selected for determining the POH (PS-current), though other selection criteria may be practiced in other embodiments. The POH(Memory-new) value is zero if the memory device is a brand new, unused device; else it has a positive value representing the power-on-hours of previous installations and use, for example in the case of a provision of the memory from a stock of used, "field replaceable unit" (FRU) units. As the POH(Offset) is the difference between the power supply and the memory device power-on-hours, it may be positive or a negative value.

At 112 the processing unit determines if the (sole, or primary) power supply that supplies operative power to the memory device is a new device, in effect if it has been replaced since a last, previous POST power-up at 102 or since the determination of the power-on-hour offset for the memory installation at 110. If so, then at 114 the power-on-hour offset is updated as a function of the POH(PS-current) for the new power supply, and the updated power-on-hour offset saved to the free area space of the memory device.

Until the system is powered down at 116, the process loops back to 106 to thereby continuously save current operating environment observations and parameters to the free space SPD areas. Upon a power down determination at 116, at 118 an accumulated power-on-hour ("POH(Memory-Acc)") is determined for the memory device and saved to the SPD free area by subtracting the power-on-hour offset from the current power-on-hour value of the computer system power supply for the memory device, thus according to the expression: {POH(Memory-Acc)=POH(PS-current)−POH(Offset)}.

Thus, the present embodiment provides for a robust, persistent determination of the current operating parameters and an accumulated power-on-hour of the memory device that may be accessed after failure of the computer system or memory device itself. Unlike the prior art, this diagnostic information is not determined or kept by a memory controller, and therefore lost upon loss of power to the memory device or computer system, or upon failure of the Basic Input Output System (BIOS) or other operating environment of the computer system. Furthermore, such data can be uploaded to a central database for trend analysis, to provide a source for lessons learned and improve the robustness of predictive failure algorithms that call out failure in the field, for example via a "Call Home" function.

In some examples, the computer system BIOS is configured to collect and store the memory and system performance and configuration data at 106, as well as the power-on-offset determination at 110 and 114 and the accumulated power-on-hour count for the memory at 118. Embodiments may provide a systematic approach to continually collect system data, and in particular at the time of a memory Error-Correction Code (ECC) failure. Such data is useful for problem recreation, failure analysis, root cause finding, and problem fixing. Furthermore, since the critical system and failure information are retained in persistent regions on the memory module, suppliers and other service providers may also benefit from having immediate access to data needed to work on a failure problem.

Example Implementation.

In one example the system and process of FIG. 1 provides a mechanism to perform a First Failure Data Capture for a DIMM DDR3 SDRAM memory in the "x86" computer system space defined by processing chips manufactured by the Intel Corporation and the Advanced Micro Devices ("AMD") Corporation, by using and populating data within the EEPROM SPD address space as follows:

Byte 0: Number of Serial PD Bytes Written/SPD Device Size/CRC Coverage

Byte 1: SPD Revision.

Byte 2: Key Byte/DRAM Device Type
Byte 3: Key Byte/Module Type.
Bytes 4 through 174: reserved.
Byte 175: Manufacturer's Specific Bytes for Load Reduced Memory Module Types.
Bytes 176 and 177: this is the beginning of the upper 80-byte user free space, and the present example may populate Bytes 176 and 177 with the POH(Memory-Acc), POH(Offset), POH(PS-current) and POH(Memory-new) values. Other useful information may also be stored at these locations, for example relevant to issues related to latency defects and long term reliability correlation, including Mean Time Between Failures (MTBF) data.
Bytes 179-178: Total System Memory Size.
Byte 180: Socket per Channel Loading.
Bytes 181.0-181.3 (bit 0 to 3 of Byte 181): Failed Memory Card or Failed External Memory Expansion Unit.
Bytes 181.4-181.7: Number of Channels per CPU socket.
Bytes 182.0-182.3: This a four bit counter used to accumulate historic, Prior Single Bit PFA (Protective Failure Analysis) fail events. This is useful to consider in context with the data stored at Bytes 185.0-185.3, Single Bit Error PFA Criteria at time of failure that is discussed below. This gives a historical performance context to a current, recent failure.
Bytes 182.4-182.5: SDRAM Refresh Rate at Time Of Single Bit PFA fail. The memory generally operates at a nominal refresh rate, but when the memory temperature increases or the system gets busier the refresh rate may increase.
Bytes 182.6 and 182.7: indicates the actual location of the memory installation, more particularly whether it was a manufacturing installation or instead and option upgrade. This field is programmed by system firmware during POST using Mfg. Mode bit to identify if a memory DIMM is installed at an "In Manufacturing" box line, or is instead post-shipped and installed in the field by a business partner, distributor or end user. This information may be useful to quickly identify sources of a suspect (for example, counterfeit) memory, or perhaps provide a trail back to the source of a manufacturing defect: for example, if about 50% of failing memories were installed as option upgrade in System X by Vendor Y, this information may is useful to quickly identify a source of a suspect memory, such as counterfeit or a manufacturing defect source.
Byte 183.0: Memory Hot-Plug status. This indicates if the system supports a memory hot plug, which may encompass the use of additional hardware and software resources. If so, then a subsequent diagnostic process may look to determining whether the use of said additional hardware and software resources may be related to a memory failure.
Bytes 183.1-183.3: DIMM Isolation Capability.
Bytes 183.4-183.7: Memory Operating Mode.
Bytes 184.0-184.1: Number of Memory Expansion Board Installed.
Bytes 184.2-184.3: Memory Expansion Board Version.
Bytes 184.4-184.7: Number of Processor Installed.
Bytes 185.0-185.3: Single Bit Error PFA (Protective Failure Analysis) Criteria at time of failure. This is useful for monitoring compliance with a specification for a number allowable rate of correctible singe-bit errors (for example, number of errors within a defined window of time). The window of time may be mutable, for example 10 seconds or 24 hours.
Bytes 185.4-185.7: This indicates the Single Bit Error PFA window at a time of failure.
Bytes 209-186: Reserved for MCA & MCB Data or UE fatal data. These areas, and certain areas below, are designated for anticipated improvements or revisions in SPD versions that will support additional error data determinations incorporated into BIOS.
Bytes 210-221: Contain useful data pertaining to a failed DIMM memory device bank, row, column, address, chip select and DQ at a time of fail. In one aspect, the embodiments collect and encode data here that is typically held within the memory controller and therefore lost upon loss of power, and thus would otherwise have to be recreated during a subsequent, diagnostic step after return of a failing memory device to a service provider. These twelve bytes of information can significantly improve turn-around time for problem or failure recreation, correlation, analysis, root cause determination and corrective action by a diagnostic service provider, which may improve field quality and reduce NDF rates.
Bytes 225-222: Intel® MRC (Memory Reference Code) Warning Code (For Intel®Platforms). (Intel, Intel logo, Intel Inside, Intel Inside logo, Intel Centrino, Intel Centrino logo, Celeron, Intel Xeon, Intel SpeedStep, Itanium, and Pentium are trademarks or registered trademarks of Intel Corporation or its subsidiaries in the United States and other countries.)
Bytes 227-226.7-4: 1.5 bytes for Intel® MRC version (For Intel® Platform).
Bytes 229.3-0-228: System IMM/BMC version (1.5 bytes).
Bytes 230-229.7-4: UEFI/BIOS version (1.5 bytes).
Byte 231: Failed DIMM Temperature; and Byte 232.7: Failed DIMM Temperature Status. This data comes from the architecture of the computer system, and is usually held within the computer system processor or integrated memory controller, and thus generally lost when power is lost under the prior art. DDR3 and other memory forms have their own internal memory sensors, and this byte usage thereby takes advantage of this ability to individually collect temperature data for each memory. Failed DIMM Temperature Status is only one bit of data (Byte 232.7) and indicates a binary in-spec or out-of-spec performance.
Byte 232.6: indicates if Self Refresh Mode (Memory Power Saving) is enabled. This data may indicate failures associated with power savings modes, for example indicating if the memory was in a sleep or other power saving mode during a failure event. In some examples, when a system "wakes up" a memory from a power saving mode a data refresh may not work properly, and this data may help a diagnostic process focus on such power savings modes.
Bytes 232.3-232.5: indicates Vdd or Mixing Vdd status. This is useful in the case of memories that support multiple voltage profiles, to indicate which voltage profile was in use at failure of the memory. For example, a DDR3 memory is designed to support 1.350 volts, but may also operate at 1.50 volts, and failure at this alternative 1.50 volt profile may indicate problems with operating at the alternative voltage profile.
Byte 232.2: Valid Memory Configuration. This data indicates if the memory has added to the computer system and populated correctly, for example whether or not an added memory module is in a properly supported area in view of the BIOS.
Bytes 232.1-232.0: indicates Post Fail, Runtime Fail, or Diagnostic Test Fail status.
Bytes 236-233: Time to Fail, in day:hh:mm format. This field is the calculated time from system power up to DIMM ECC PFA event occurred, and it's recorded by system firmware in the present embodiment, rather than kept within the computer system processor or integrated memory controller and thus generally lost when power is lost under the prior art.

Bytes 239-237: Last Error Timestamp (for example, month:date:year format). This field is recorded by system firmware after a memory ECC PFA error.

Bytes 240.0-240.2: Memory Bus Speed. This field is programmed by the system firmware.

Bytes 240.3-240.7: Accumulate Uncorrectable Error Counter. This counter field is updated after an uncorrectable error for the computer system or machine. This counter should persist and accumulate for a same computer system (associated with a consistent serial number), and not reset.

Bytes 242-241: Processor SKU Information.

Byte 243: Processor Vendor & CPU Type.

Bytes 244-247: system machine type data that is programmed at Mfg. box line and useful for identifying unsupported memory configurations for a subject computer system machine type.

Bytes 248-254: unique system serial number that is programmed at Mfg. box line and may help to correlate field data.

Byte number 255: used to designate the SPD decoder version supported by the firmware of the computer system incorporating the memory module. In one example the SPD version is IBM® SPD version 1.0, and the firmware executed by the processing unit of the computer system is a Unified Extensible Firmware Interface (UEFI) BIOS, and/or an on-board Management Controller BMC (IMM/BMC). (IBM is a registered trademark of International Business Machines Corporation in the United States and other countries). The SPD version designated at byte number 255 generally defines the size of the user SPD free area, the start and end location, format, contents, and method of encoding and decoding the data. In present example this byte defines Byte 176 as the starting point and Byte 255 as the end point of the free user space, inclusively. The SPD method further systematically encodes the data fields in the free area, wherein a service provider or an automated tool may recognize and automatically retrieve and manipulate data stored at Bytes 176 through 255 as a function of recognized the SPD version indicated at Byte 255.

It will be understood that the examples discussed above are merely illustrative and not exhaustive, and that other embodiments may be practiced on other memory devices and system platforms, and different EEPROM bytes may be used for different data purposes. For example, the systems, methods or processes described herein may also apply to double data rate type 4 synchronous dynamic random access memory or other, newer generations of memory devices, wherein the free and reserved areas of the electrically erasable programmable read-only of the memory device are different in size or location. Byte fields may also be selectively modified or removed based on a system requirement, the SPD firmware deployed, and a processor chipset's reliability, availability, and serviceability (RAS) capability. For example, recognizing system attributes (such as number of processors, type of BIOS system, etc.) may cause the data collection and storage (at 106, FIG. 1) to choose between possible data items as a function of the limited space available: if only 80 bytes are available in the free area, then a first data item may be chosen over a second data item, and the second data item not stored in this free area. Or perhaps fewer bits within a designated byte area may be given to the second item data in some implementations, with some of the bits reallocated to other data items.

The data persistently recorded in the memory device free areas described above may also be uploaded to a smart data analysis tool via network or other data transfer media such as USB key, CD or HDD before the memory device data gets removed or cleared. Furthermore, the order of each of the byte fields can be rearranged or modified to differently for different systems to meet particular system needs. For example, the byte locations of the data noted above may be different for a system with DDR4 memory, relative to a system with newer generation of Intel, AMD or PowerPC™ processors. (POWERPC is a registered trademark of International Business Machines Corporation in the United States and other countries.)

In one aspect of the embodiments, the recorded POH data on the memory device may be used as a screening tool, for example when there is a need to generally retire aged or overly-stressed memory devices from a deployed field population. The information may be especially helpful in dynamically complying with new or revised standards, for example identifying older memory devices as those having total POH values over a given threshold, that should be retired and replaced with newer memory devices that perform in better compliance with newer standards in specified air-cooled data center environments, for example ASHRAE (American Society of Heating, Refrigeration, and Air-conditioning Engineers) class A3 and A4 standards which allow 5 C-40 C and 5 C-45 C temperatures in data centers (respectively).

Accordingly, embodiments of the present invention may provide accurate and detailed information to help reproduce and analyze failure off-line so that NDF can be reduced. Trends may be collected across multiple DIMM types, vendors and server models in a single database as parts come back from field. Trends collected may be used in a feedback loop that helps improve predictive failure processes in server firmware algorithms that call out failure in the field. By systematically collecting the power-on-hour data for a memory module, embodiments may be used in development and test cycles to improve defect fix turnaround time: as the data is captured at time of failure, there is no need to re-run the test case or install a tool to capture the failure that may otherwise take a long time to reproduce.

Figure 2:
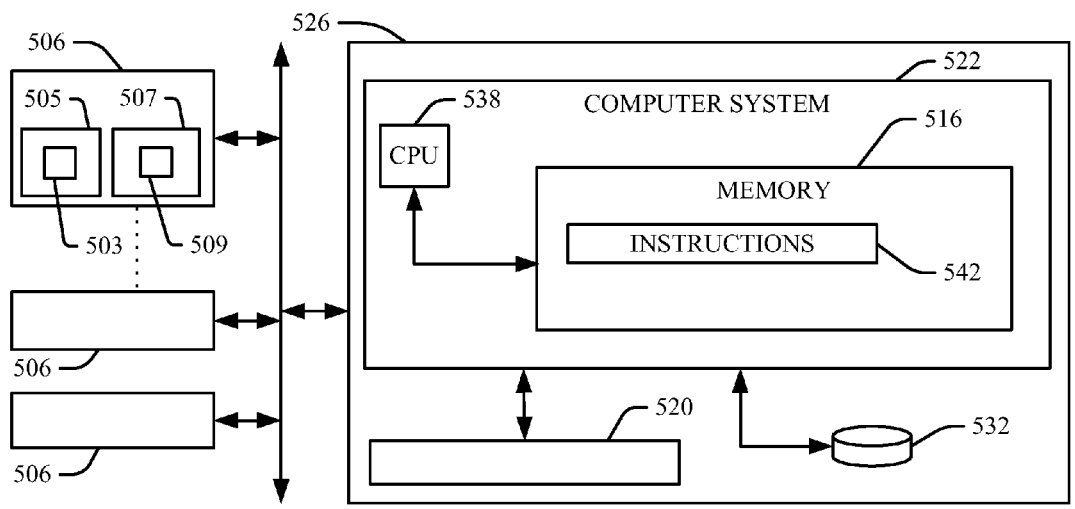
FIG. 2 is a block diagram illustration of a computer system implementation of an embodiment of the present invention.

Referring now to FIG. 2, an exemplary computerized implementation of an embodiment of the present invention includes a computer system or other programmable device 522 in communication with installed memory modules 506, wherein the device 522 collects SPD data 503 from reserved EEPROM areas 505 of the memory devices 506 and determines performance data with respect to the memory devices 506 and populates the collected and determined data 509 in free EEPROM areas or other persistent memory components 507 of the memory devices 506 as described above with respect to FIG. 1. Instructions 542 reside within computer readable code in a computer readable memory 516, or in a computer readable storage system 532, or other tangible computer readable storage medium that is accessed through a computer network infrastructure 526 by a processing unit (CPU) 538. Thus, the instructions, when implemented by the processing unit (CPU) 538, cause the processing unit (CPU) 538 to determine, collect and store the data 509 in the persistent memory component 507 of the memory device 506 as discussed above.

Figure 3:
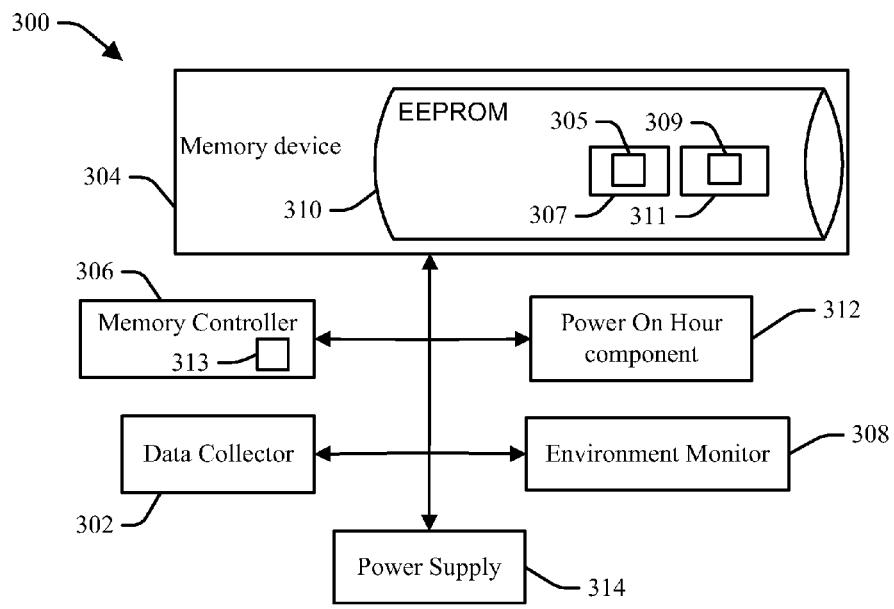
FIG. 3 is a block diagram illustration of computer system or device architecture according to an embodiment of the present invention.

FIG. 3 illustrates a computer system apparatus or device embodiment 300 of the present invention, wherein a Data Collector 302 collects SPD EEPROM operating environment data 305 from reserved areas 307 of an EEPROM 310 of a computer system Memory device 304 (for example, a DIMM or other device), and data 313 from a Memory Controller 306 of a computer system that controls the Memory Device 304. An Environment Monitor 308 processes the data collected by the Data Collector 302 and thereby performance data with respect to the Memory Device 304 and populates the collected data 309 in free areas 311 of the EEPROM or other persistent memory component 310 of the Memory Device 304, as described above with respect to FIGS. 1 and 2.

A Power On Hour component 312 uses the data collected by the Data Collector 302 to determine a power-on-hour offset for the Memory Device 304 (by subtracting a current power-on-hour count of the Memory Device 304 from a current power-on-hour value of a computer system Power Supply 314 that supplies operative power to the Memory Device 304), and save the determined power-on-hour offset into one or more bytes of a free area of the EEPROM 310 of the Memory Device 304 that is designated by computer system firmware for the power-on-hour offset. Further, in response to an indication of that the computer system 302 is powering down, the Power On Hour component 312 determines an accumulated power-on-hour for the Memory Device 304 by subtracting the power-on-hour offset of the Memory Device 304 from a current power-on-hour value of the computer system Power Supply 314, and saves the accumulated power-on-hour for the memory device to one or more bytes designated by the computer system firmware within the free area of the Memory Device 304 EEPROM 310. Within the EEPROM 310 the free area bytes are different from the reserved area bytes, each of the free area bytes are available for data storage by the Memory Controller 306, and data stored in the free area bytes persists after operative power is lost to the Memory Device 304, the Memory Controller 306 or the computer system 302.

Embodiments of the present invention may also perform process steps of the invention on a subscription, advertising, and/or fee basis. That is, a service provider could offer to integrate computer-readable program code into the computer system 522 of FIG. 2, or into the Data Collector 302 and the Power On Hour component 308, the to enable the computer system 522, Data Collector 302 or Power On Hour component 308 to collect and determine performance data with respect to the memory devices 506 or Memory Device 304 and populates the collected data in an EEPROM 310 or other persistent memory component 507 of the memory devices 506 as described above with respect to FIGS. 1 and 2. The service provider can create, maintain, and support, etc., a computer infrastructure such as the computer system 522, network environment 526, article 302, or parts thereof, that perform the process steps of the invention for one or more customers. In return, the service provider can receive payment from the customer(s) under a subscription and/or fee agreement and/or the service provider can receive payment from the sale of advertising content to one or more third parties. Services may comprise one or more of: (1) installing program code on a computing device, such as the computer device 522, from a tangible computer-readable medium device 520 or 532; (2) adding one or more computing devices to a computer infrastructure; and (3) incorporating and/or modifying one or more existing systems of the computer infrastructure to enable the computer infrastructure to perform the process steps of the invention.

The terminology used herein is for describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. Certain examples and elements described in the present specification, including in the claims and as illustrated in the Figures, may be distinguished or otherwise identified from others by unique adjectives (e.g. a "first" element distinguished from another "second" or "third" of a plurality of elements, a "primary" distinguished from a "secondary" one or "another" item, etc.) Such identifying adjectives are generally used to reduce confusion or uncertainty, and are not to be construed to limit the claims to any specific illustrated element or embodiment, or to imply any precedence, ordering or ranking of any claim elements, limitations or process steps.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for collecting memory device performance data and populating the data in a persistent memory component of the memory device, the method comprising:

determining via a power-on self-test whether a memory device installed on a computer system is a newly installed memory, wherein the power-on self-test collects serial presence detect data from each of a plurality of bytes of a reserved area of electrically erasable programmable read-only memory of the memory device that are each reserved for encoding manufacturer information for the memory device, and a processing unit of the computer system automatically uses the collected serial presence detect data to configure a memory controller of the computer system to interface with the memory device;

in response to determining that the memory device is a newly installed memory, determining a power-on-hour offset for the memory device by subtracting a current power-on-hour count of the memory device from a current power-on-hour value of a computer system power supply that supplies operative power to the memory device;

saving the determined power-on-hour offset into a byte of a free area of the electrically erasable programmable read-only memory of the memory device that is designated by computer system firmware for the power-on-hour offset; and in response to the computer system powering down, determining an accumulated power-on-hour for the memory device by subtracting the power-on-hour offset of the memory device from a current power-on-hour value of the computer system power supply, and saving the accumulated power-on-hour for the memory device to a byte designated by the computer system firmware within the free area of the electrically erasable programmable read-only memory of the memory device for the accumulated power-on-hour for the memory device;

wherein the free area bytes are different from the reserved area bytes, each of the free area bytes are available for data storage by the memory controller, and data stored in the free area bytes persists after operative power is lost to the memory device, the memory controller or the computer system.

2. The method of claim 1, further comprising:
determining if the power supply is a newly installed device since the determination of the power-on-hour offset; and
in response to determining that the power supply is newly installed since the determination of the power-on-hour offset, updating the power-on-hour offset for the memory device by subtracting the current power-on-hour count of the memory device from a current power-on-hour count of the newly-installed computer system power supply, and saving the updated power-on-hour offset to the byte designated by the computer system firmware within the free area of the electrically erasable programmable read-only memory of the memory device for the power-on-hour offset.

3. The method of claim 2, further comprising:
collecting operating environment observation data that is relevant to the operation of the memory device during operation of the memory device;
storing the collected operating environment observation data into free area bytes of the electrically erasable programmable read-only memory of the memory device that are designated for operating environment observation data by the computer system firmware; and
continuously updating the collected operating environment observation data, and storing the updated collected operating environment observation data into the free area bytes of the electrically erasable programmable read-only memory of the memory device that are designated for the operating environment observation data by the computer system firmware, until the computer system powers down.

4. The method of claim 3, further comprising:
if there is a plurality of power supplies that are supplying operative power to the memory device, selecting a primary power supply of the plurality of power supplies for determining the current computer system power supply power-on-hour count.

5. The method of claim 3, further comprising:
integrating computer-readable code into a computing system comprising a processing unit, wherein the computer-readable code, when executed by the computer system processing unit, causes the processing unit to perform the steps of:
the determining via the power-on self-test whether the memory device installed is newly installed memory;
the determining and saving the power-on-hour offset for the newly installed memory into the free area of the electrically erasable programmable read-only memory of the memory device;
the determining and saving the accumulated power-on-hour for the memory device to the free area of the memory device electrically erasable programmable read-only memory;
the updating the power-on-hour offset for the memory device in response to the determining that the power supply is newly installed since the determination of the power-on-hour offset, and
the collecting, continuously updating and storing the operating environment observation data that is relevant to the operation of the memory device during operation of the memory device into the free area of the electrically erasable programmable read-only memory of the memory device, until the computer system powers down.

6. The method of claim 3, wherein the operating environment observation data that is collected and stored into the free area bytes designated for operating environment observation data by the computer system firmware comprises a failed DIMM memory device bank, row, column, address, chip select and data lines at a time of failure of the memory device.

7. The method of claim 6, wherein the step of collecting the operating environment observation data further comprises determining a time to fail of the memory device as an elapsed time from a time of power up of the system to a time that a Protective Failure Analysis event occurred; and
wherein the step of storing the collected operating environment observation data into the free area bytes of the electrically erasable programmable read-only memory of the memory device that are designated for operating environment observation data by the computer system comprises storing the determined time to fail.

8. The method of claim 7, wherein the step of collecting the operating environment observation data further comprises determining which voltage profile of a plurality of voltage profiles that are supported by the memory device was in use at the time of failure of the memory; and
wherein the step of storing the collected operating environment observation data into the free area bytes of the electrically erasable programmable read-only memory of the memory device that are designated for operating environment observation data by the computer system comprises storing the determined voltage profile that was determined to be in use.

9. The method of claim 8, wherein the memory device is a double data rate type three synchronous dynamic random access memory;
wherein the reserved area of the electrically erasable programmable read-only memory of the memory device is a lower 176 bytes of serial presence detect data EEPROM address space, comprising byte 0 through byte 175 inclusive of a total EEPROM address space comprising byte 0 through byte 255 inclusive, that is reserved to encode device information; and
wherein the free area of the electrically erasable programmable read-only memory of the memory device is an upper 80 bytes of the total EEPROM address space comprising byte 176 through byte 255 inclusive, that is freely available for use by the computer system.

10. A system, comprising:
a processing unit;
a computer readable memory in communication with the processing unit;
a computer-readable storage medium in communication with the processing unit;
a memory device installed on the system; and
a power supply that supplies operative power to the memory device
wherein the processing unit, when executing program instructions stored on the computer-readable storage medium via the computer readable memory:
determines via a power-on self-test whether the memory device is a newly installed memory device, wherein the power-on self-test collects serial presence detect data from each of a plurality of bytes of a reserved area of electrically erasable programmable read-only memory of the memory device that are each reserved for encoding manufacturer information for the memory device;
automatically uses the collected serial presence detect data to configure a memory controller to interface with the memory device;

in response to determining that the memory device is a newly installed memory device, determines a power-on-hour offset for the memory device by subtracting a current power-on-hour count of the memory device from a current power-on-hour value of the power supply;

saves the determined power-on-hour offset into a byte of a free area of the electrically erasable programmable read-only memory of the memory device that is designated for the power-on-hour offset; and in response to the system powering down, determines an accumulated power-on-hour for the memory device by subtracting the power-on-hour offset of the memory from a current power-on-hour value of the power supply, and saves the accumulated power-on-hour for the memory device to a byte designated within the free area of the electrically erasable programmable read-only memory of the memory device for the accumulated power-on-hour for the memory device;

wherein the free area bytes are different from the reserved area bytes, each of the free area bytes are available for data storage by the memory controller, and data stored in the free area bytes persists after operative power is lost to the memory device, the memory controller or the system.

11. The system of claim 10, wherein the processing unit, when executing the program instructions stored on the computer-readable storage medium via the computer readable memory, further:

determines if the power supply is a newly installed device since the determination of the power-on-hour offset; and in response to determining that the power supply is newly installed since the determination of the power-on-hour offset, updates the power-on-hour offset for the memory device by subtracting the current power-on-hour count of the memory device from a current power-on-hour count of the newly-installed computer system power supply, and saves the updated power-on-hour offset to the byte designated by the computer system firmware within the free area of the electrically erasable programmable read-only memory of the memory device for the power-on-hour offset.

12. The system of claim 11, wherein the processing unit, when executing the program instructions stored on the computer-readable storage medium via the computer readable memory, further:

collects operating environment observation data that is relevant to the operation of the memory device during operation of the memory device;

stores the collected operating environment observation data into free area bytes of the electrically erasable programmable read-only memory of the memory device that are designated for operating environment observation data by the computer system firmware; and continuously updates the collected operating environment observation data, and stores the updated collected operating environment observation data into the free area bytes of the electrically erasable programmable read-only memory of the memory device that are designated for the operating environment observation data by the computer system firmware, until the computer system powers down.

13. The system of claim 12, wherein the processing unit, when executing the program instructions stored on the computer-readable storage medium via the computer readable memory, further:

if there is a plurality of power supplies that are supplying operative power to the memory device, selects a primary power supply of the plurality of power supplies for determining the current computer system power supply power-on-hour count.

14. The system of claim 12, wherein the operating environment observation data that is collected and stored into the free area bytes designated for operating environment observation data by the computer system firmware comprises a failed DIMM memory device bank, row, column, address, chip select and data lines at a time of failure of the memory device; and wherein the processing unit, when executing the program instructions stored on the computer-readable storage medium via the computer readable memory, determines a time to fail of the memory device as an elapsed time from a time of power up of the system to a time that a Protective Failure Analysis event occurred, and stores the determined time to fail into the free area bytes of the electrically erasable programmable read-only memory of the memory device that are designated for operating environment observation data.

15. The system of claim 14, wherein the processing unit, when executing the program instructions stored on the computer-readable storage medium via the computer readable memory, further determines which voltage profile of a plurality of voltage profiles that are supported by the memory device was in use at the time of failure of the memory, and stores the determined voltage profile into the free area bytes of the electrically erasable programmable read-only memory of the memory device that are designated for operating environment observation data.

16. An article of manufacture, comprising:

a non-transitory computer readable tangible storage medium having computer readable program code embodied therewith, the computer readable program code comprising instructions that, when executed by a computer system processing unit, cause the processing unit to:

determine via a power-on self-test whether a memory device installed on the computer system is a newly installed memory device, wherein the power-on self-test collects serial presence detect data from each of a plurality of bytes of a reserved area of electrically erasable programmable read-only memory of the memory device that are each reserved for encoding manufacturer information for the memory device;

automatically use the collected serial presence detect data to configure a memory controller to interface with the memory device;

in response to determining that the memory device is a newly installed memory device, determine a power-on-hour offset for the memory device by subtracting a current power-on-hour count of the memory device from a current power-on-hour value of a power supply that supplies operative power to the memory device;

save the determined power-on-hour offset into a byte of a free area of the electrically erasable programmable read-only memory of the memory device that is designated for the power-on-hour offset; and in response to the system powering down, determine an accumulated power-on-hour for the memory device by subtracting the power-on-hour offset of the memory from a current power-on-hour value of the power supply, and save the accumulated power-on-hour for the memory device to a byte designated within the free area of the electrically erasable programmable read-only memory of the memory device for the accumulated power-on-hour for the memory device;

wherein the free area bytes are different from the reserved area bytes, each of the free area bytes are available for data storage by the memory controller, and data stored in the free area bytes persists after operative power is lost to the memory device, the memory controller or the system.

17. The article of manufacture of claim 16, wherein the computer readable program code instructions, when executed by the processing unit, further cause the processing unit to:
  determine if the power supply is newly installed device since the determination of the power-on-hour offset; and
  in response to determining that the power supply is newly installed since the determination of the power-on-hour offset, update the power-on-hour offset for the memory device by subtracting the current power-on-hour count of the memory device from a current power-on-hour count of the newly-installed computer system power supply, and save the updated power-on-hour offset to the byte designated by the computer system firmware within the free area of the electrically erasable programmable read-only memory of the memory device for the power-on-hour offset.

18. The article of manufacture of claim 17, wherein the computer readable program code instructions, when executed by the processing unit, further cause the processing unit to:
  collect operating environment observation data that is relevant to the operation of the memory device during operation of the memory device;
  store the collected operating environment observation data into free area bytes of the electrically erasable programmable read-only memory of the memory device that are designated for operating environment observation data by the computer system firmware; and
  continuously update the collected operating environment observation data, and store the updated collected operating environment observation data into the free area bytes of the electrically erasable programmable read-only memory of the memory device that are designated for the operating environment observation data by the computer system firmware, until the computer system powers down.

19. The article of manufacture of claim 18, wherein the operating environment observation data that is collected and stored into the free area bytes designated for operating environment observation data comprises a failed DIMM memory device bank, row, column, address, chip select and data lines at a time of failure of the memory device; and
  wherein the computer readable program code instructions, when executed by the processing unit, further cause the processing unit to determine a time to fail of the memory device as an elapsed time from a time of power up of the system to a time that a Protective Failure Analysis event occurred, and to store the determined time to fail into the free area bytes of the electrically erasable programmable read-only memory of the memory device that are designated for operating environment observation data.

20. The article of manufacture of claim 19, wherein the computer readable program code instructions, when executed by the processing unit, further cause the processing unit to determine which voltage profile of a plurality of voltage profiles that are supported by the memory device was in use at the time of failure of the memory, and to store the determined voltage profile into the free area bytes of the electrically erasable programmable read-only memory of memory device that are designated for operating environment observation data.

* * * * *